(12) United States Patent
Idei

(10) Patent No.: US 6,867,626 B2
(45) Date of Patent: Mar. 15, 2005

(54) CLOCK SYNCHRONIZATION CIRCUIT HAVING BIDIRECTIONAL DELAY CIRCUIT STRINGS AND CONTROLLABLE PRE AND POST STAGE DELAY CIRCUITS CONNECTED THERETO AND SEMICONDUCTOR DEVICE MANUFACTURED THEREOF

(75) Inventor: Yoji Idei, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/624,801

(22) Filed: Jul. 22, 2003

(65) Prior Publication Data

US 2004/0150440 A1 Aug. 5, 2004

(30) Foreign Application Priority Data

Jul. 24, 2002 (JP) ........................................ 2002-215765

(51) Int. Cl.[7] ................................................ H03L 7/00
(52) U.S. Cl. ........................ 327/141; 327/161; 327/294; 327/298
(58) Field of Search ................................. 327/141, 161, 327/152–154, 261, 264, 284, 269–272, 276–278, 285, 291, 293, 294, 298, 407; 326/93

(56) References Cited

U.S. PATENT DOCUMENTS

| | | | | |
|---|---|---|---|---|
| 5,870,445 A | * | 2/1999 | Farwell | 375/371 |
| 6,069,508 A | * | 5/2000 | Takai | 327/161 |
| 6,239,641 B1 | * | 5/2001 | Lee | 327/270 |
| 6,359,480 B1 | * | 3/2002 | Isobe et al. | 327/141 |
| 6,434,062 B2 | * | 8/2002 | Lee | 365/194 |
| 6,437,619 B2 | * | 8/2002 | Okuda et al. | 327/158 |
| 6,574,163 B2 | * | 6/2003 | Maeda | 365/233 |
| 6,621,316 B1 | * | 9/2003 | Kirsch | 327/161 |
| 6,703,879 B2 | * | 3/2004 | Okuda et al. | 327/158 |
| 6,727,740 B2 | * | 4/2004 | Kirsch | 327/161 |

FOREIGN PATENT DOCUMENTS

| | | | |
|---|---|---|---|
| JP | 11-66854 | | 3/1999 |
| JP | 02004064143 A | * | 2/2004 |

* cited by examiner

Primary Examiner—Timothy P. Callahan
Assistant Examiner—Hai L. Nguyen
(74) Attorney, Agent, or Firm—Choate, Hall & Stewart

(57) ABSTRACT

A clock synchronization circuit includes a first delay circuit for delaying a clock signal and outputting the delayed clock signal, first and second bidirectional delay circuit strings, a first pre-stage delay circuit and a first post-stage delay circuit of variable delay time type, arranged in a pre-stage and a post-stage of the first bidirectional delay circuit string (BDDA), a second pre-stage delay circuit and a second post-stage delay circuit of variable delay time type, arranged in a pre-stage and a post-stage of the second bidirectional delay circuit string (BDDB), and a multiplexer, supplied with and multiplexing outputs of the first and second post-stage delay circuits to output the resulting signals. An output signal of the first delay circuit is supplied in common to the first and second pre-stage delay circuits. A first path composed of the first pre-stage delay circuit, first bidirectional delay circuit string and the first post-stage delay circuit and a second path composed of the second pre-stage delay circuit, second bidirectional delay circuit string and the second post-stage delay circuit are alternately switched in an interval of one cycle of the clock signal.

20 Claims, 11 Drawing Sheets

US 6,867,626 B2

CLOCK SYNCHRONIZATION CIRCUIT HAVING BIDIRECTIONAL DELAY CIRCUIT STRINGS AND CONTROLLABLE PRE AND POST STAGE DELAY CIRCUITS CONNECTED THERETO AND SEMICONDUCTOR DEVICE MANUFACTURED THEREOF

FIELD OF THE INVENTION

This invention relates to a clock synchronization circuit and, more particularly, to a clock synchronization circuit having a BDD (Bi-Directional Delay) circuit which is retained to be convenient when used for a circuit for synchronizing a data output of a DDR-SDRAM (double data rate synchronous DRAM) to a clock signal, and to a semiconductor device having the clock synchronization circuit.

BACKGROUND OF THE INVENTION

FIG. 9A shows an illustrative circuit configuration of a clock synchronization circuit which has a BDD (Bi-Directional Delay) circuit, also termed a bidirectional type delay circuit, as a delay circuit. FIG. 9B shows an operation of the circuit shown in FIG. 9A. Referring to FIG. 9A, the clock synchronization circuit is made up by a clock buffer (CLKB) 401 which receives an external clock signal (CLK) and a complementary signal (/CLK) thereof to output an internal clock signal (ICLK), a replica circuit (REP) 402 which receives and delays the internal clock signal (ICLK) to output a delayed signal, a phase selection circuit (PHR) 403 which receives the internal clock signal (ICLK) to output first and second control signals (PHA and PHB) for phase selection, a control circuit (CSA) 404, a control circuit (CSB) 405, a delay circuit string of the BDDA configuration (BDDA) 406, a delay circuit string of the BDDA configuration (BDDB) 407, a multiplexer 408 (MUX), which receives outputs of the delay circuit string (BDDA) 406 and the delay circuit string (BDDB) 407 for multiplexing into one output, and an output circuit (output buffer circuit) (DOB) 409. This output circuit (DOB) 409, which is an output circuit in a synchronous DRAM, also termed an SDRAM, receives a clock signal output from the multiplexer 408 (MUX) to output data (readout data) at a data output terminal (DQ) in synchronism with edges of the clock signal. The delay time tREP of the replica circuit (REP) 402 is set so as to be equal to the sum of the delay time t1 of the clock buffer 401 and the delay time t2 of the multiplexer 408 and the output circuit (DOB) 409. That is, $$tREP = t1 + t2 \quad (1)$$

Meanwhile, since the delay of the control circuit (CSA) 404 and the delay of the control circuit (CSB) 405 (delay as from a transition edge of the internal clock signal (ICLK) until the turn control signal (AFWD/ABWD) or the delay as from the output (STO) of the replica circuit 402 until the input AOA/AOB of the delay circuit strings 406 and 407 of the BDD configuration) is small as compared to the delay t1 and t2 and is not relevant to the structure and the operation of the present invention, these are disregarded in the following description.

If, in FIG. 9A, attention is directed to the phase A composed of the control circuit (CSA) 404 and the delay circuit string (BDDA) 406, the rising edge (R0) of the external clock signal (CLK) is output as a signal (ST0) through the clock buffer (CLKB) 401 (delay time=t1) and the replica circuit (REP) 402 (delay time tREP=t1+t2) so as to be output from the control circuit (CSA) 404 as a signal (AOA). This signal (AOA) is supplied to an input terminal of the delay circuit string (BDDA) 406. On selection of the phase A, the control signal (PHA) from the phase selection circuit (PHR) 403 is activated. The control circuit (CSA) 404 is supplied with the signal (ST0) from the replica circuit (REP) 402 to output the received signal as the signal AOA. The turn control signal AFWD/ABWD, output from the control circuit (CSA) 404, represents the forward direction. The edge of the clock input to the delay circuit string 406 via input terminal proceeds in one direction (rightward direction in the drawing). At a time point the clock edge has proceeded through the inside of the delay circuit string 406 a certain predetermined time by the turn control signal (AFWD/BFWD) generated in the control circuit (CSA) 404 responsive to the rising edge (R1) of the external clock signal (CLK), the proceeding direction of the clock edge is reversed. Thus, the clock edge proceeds towards left in the drawing and presents itself at an output (BOB) of the delay circuit string (BDDB) 407. The time as from the inputting of the clock edge at the input terminal of the delay circuit string 406 until a turn is equal to the time as from the turn until the outputting at the output terminal of the delay circuit string 406 (this time is indicated by [tBDD] in FIG. 9B). This represents a basic characteristic of the delay circuit string of the BDD configuration, as disclosed for example in the Japanese Patent Kokai Publication JP-A-11-66854. The edge output by the delay circuit string 406 is supplied through the multiplexer 408 (MUX) to the output circuit (DOB) 409. The output circuit (DOB) 409 then outputs data at the output terminal (DQ) in synchronism with an edge of the supplied clock edge.

The time as from the rising edge (R1) of the external clock signal (CLK) until the outputting of data from the output terminal (DQ) may be calculated to be equal to T+tBDD+t2.

On the other hand, the following equation:

$$t1 + tREP + tBDD = tCK + t1 \quad (2)$$

holds for the time as from the rising edge R0 of the external clock signal (CLK) until the turn at the delay circuit string 406.

If tREP=t1+t2 of the above equation (1) is taken into account, then we have:

$$t1 + tBDD + t2 = tCK \quad (3).$$

That is, when the phase A is selected, the outputting of the data from the data output terminal (DQ) occurs in synchronism with the rising edge (r2) of the external clock signal (CLK).

The same applies for the operation of the phase B composed of the control circuit (CSB) 405 and the delay circuit string (BDDB) 407, such that data outputting from the data output terminal (DQ) occurs in synchronism with the rising edge (R3) of the external clock signal (CLK).

By alternately switching between the phase A and the phase B at each cycle of the external clock signal (CLK) by the control signal (PHA) and the control signal (PHB), output from the phase selection circuit (PHR) 403, data can be output from the data output terminal (DQ) in synchronism with all of the rising edges of the external clock signal (CLK).

Recently, the increasing rate in the operating speed of the DDR (Double Data Rate)-SDRAM is significant, such that the operating frequency of the entire DDR-SDRAM has come to be limited by the upper limit of the operating frequency of the BDD circuit (reciprocal of the clock period tCK).

That is, as for the delay time tBDD of the delay circuit strings 406 and 407 (time which elapses as from the inputting until the turn), in FIG. 9A, there is a lower limit tBDDmin determined by the characteristic of the delay circuit string, typically 0.3 ns to 0.5 ns and, since we have a following equation $$tBDD=tCK-(t1+t2)=tCK-tREP \qquad (4)$$

the following condition must be satisfied:

$$tCK>tBDDmin+tREP \qquad (5)$$

For example, if tREP is 5 ns and tBDDmin is 0.5 ns, we have:

$$tCK>5.5 \text{ ns}$$

as a result of which, the operating frequency of the DDR-SDRAM cannot be raised to higher than about 180 MHz.

Thus, if it is desired to further raise the operating speed of the DDR-SDRAM, loaded with a delay circuit string of the BDD circuit configuration, the lower limit of the clock period tCK of the BDD delay circuit string needs to be lowered further.

In order to meet this request, there is proposed in for example the Japanese Patent Kokai Publication JP-A-11-66854 a four-phase configuration in which a phase C and a phase D are further provided in addition to the phases A and D. This configuration is shown in FIG. 10 and includes a clock buffer (CLKB) 501 which receives complementary external clock signals (CLK and /CLK) to output an internal clock signal (ICLK), a replica circuit (REP) 502 which receives the internal clock signal (ICLK), a phase selection circuit (PHR) 503 which receives the internal clock signal (ICLK) to output control signal for phase selection PHA, PHB, PHC and PHD, a control circuit (CSA) 504, a control circuit (CSB) 505, a control circuit (CSC) 506, a control circuit (CSD) 507, a delay circuit string (BDDA) 508, a delay circuit string (BDDB) 509, a delay circuit string (BDDC) 510, a delay circuit string (BDDD) 511, a multiplexer (MUX) 512 for switching between the outputs of the delay circuit string (BDDA) 508 to the delay circuit string (BDDD) 511, and an output circuit (DOB) 513, as shown in FIG. 10.

FIG. 11 is a timing diagram for illustrating the operation of the structure shown in FIG. 10. If attention is directed to the operation of the phase A, a rising edge R0 of the external clock signal (CLK) is turned around by a turn control signal AFWD/ABWD, which is generated from a rising edge R2, and data is output in synchronism with an edge R4. The same may be said of the phases B to D, that is, data may be output in synchronism with the totality of the rising edges by sequentially actuating the respective phases every CLK cycle.

As may be seen from FIG. 11, we have:

$$tBDD=2tCK-tREP \qquad (6)$$

and $$tCK>(tBDDmin+tREP)/2 \qquad (7)$$

so that, as compared to the configuration shown in FIG. 9, operation is possible up to ½ of the clock period tCK (that is, up to 2.75 ns in the above numerical example).

SUMMARY OF THE DISCLOSURE

If the scale of an additional circuit, required in the configuration shown in FIG. 10, is scrutinized, it is necessary, for achieving the four-phase operation, to provide two control circuits CSC and CSD and two delay circuit strings BBDC and BDDD, in addition to the configuration shown in FIG. 9.

If the maximum delay time of the BDD delay string, necessary for realizing the maximum cycle time tCKmax, is tBDDmax, in the illustrative structure shown in FIG. 9, we have:

$$tBDDmax=tCKmax-tREP \qquad (8)$$

whereas, in an illustrative structure shown in FIG. 10, we have:

$$tBDDmax=2tCKmax-tREP \qquad (9)$$

so that the number of stages of the delay circuit strings of the BDD structure necessary for realizing equivalent maximum cycle time tCKmax is increased.

Since the area of the delay circuit string of the BDD configuration takes up a significant proportion of the entire clock synchronization circuit, shown in FIGS. 9 and 10, the increasing circuit scale of this circuit portion leads to an increasing overhead with respect to the chip area.

Moreover, since the power dissipation when the semiconductor device is operating at the same clock period is approximately proportional to the circuit scale, the increasing power consumption also poses a problem.

Additionally, with the structure shown in FIG. 10, there is further raised a problem that, if the speed of the DDR-SDRAM is further increased, such that demand is raised for the operation at a still higher frequency, this demand cannot be coped with.

Accordingly, it is an object of the present invention to provide a clock synchronization circuit which is free of the above-mentioned problems, which is of a small area and which is able to operate at a higher frequency and a lower power consumption, and a semiconductor device provided with the clock synchronization circuit.

The above and other objects are attained by a clock synchronization circuit in accordance with an aspect of the present invention, which comprises first and second bidirectional delay circuit strings configured so that each circuit string has an input terminal and an output terminal, an edge of a clock signal input at the input terminal proceeds in one direction and then is reversed in its proceeding direction, based on a turn control signal generated on the basis of an edge of a clock signal next following the input clock signal, the clock edge proceeding in the direction reverse to the one direction, over a time equal to the time during which the clock edge has proceeded in the one direction, so as to be output at the output terminal, a first pre-stage delay circuit and a first post-stage delay circuit each of the variable delay time arranged at a pre-stage and at a post-stage of the first bidirectional delay circuit string, respectively, a second pre-stage delay circuit and a second post-stage delay circuit each of the variable delay time arranged at a pre-stage and at a post-stage of the second bidirectional delay circuit string, respectively, a multiplexing circuit for receiving output signals of the first and second post-stage delay circuits to output a multiplexed signal of the output signals of the first and second post-stage delay circuits, and a delay time setting circuit for performing control for variably setting the delay time of the first and second pre-stage delay circuits and the delay time of the first and second post-stage delay circuits, wherein the input clock signal is supplied common to the input terminals of the first and second pre-stage delay circuits, and wherein the clock synchronization circuit further comprises phase selection controlling means for alternately selecting a first path including the first pre-stage delay circuit, the first bi-directional delay circuit string and the first post-stage delay circuit string and a second path including the second pre-stage delay circuit, the second bi-directional delay circuit string and the second post-stage delay circuit string, in an interval of a preset cycle of the clock signal.

The clock synchronization circuit according to the present invention further comprises a first delay circuit having an input terminal and an output terminal and receiving the clock signal at the input terminal to delay the clock signal a preset delay time to output the so delayed clock signal at the output terminal, wherein the clock signal output from the output terminal of the first delay circuit is supplied in common to the input terminals of the first and second pre-stage delay circuits.

The clock synchronization circuit according to the present invention further comprises a first buffer circuit, to an input terminal of which the clock signal input to the clock synchronization circuit is supplied, an output terminal of the first buffer circuit being connected to the input terminal of the first delay circuit, and an output circuit for outputting an output signal at the signal output terminal, based on the output signal of the multiplexing circuit. The delay time of the first delay circuit is equal to the sum of the delay time of the first buffer circuit, the delay time of the multiplexing circuit and the delay time of the output circuit.

According to the present invention, the delay time setting circuit includes means for setting the delay time of the first and second pre-stage delay circuits and the delay time of the first and second post-stage delay circuits depending on the period of the clock signal and the delay time of the first delay circuit. According to the present invention, if the minimum delay time from the inputting until the turning around in each of the first and second bidirectional delay circuit strings is tBDDmin, one period of the clock signal is tCK, the delay time of the first delay circuit is tREP, the delay time of the first and second pre-stage delay circuits and the delay time of the first and second post-stage delay circuits are the same delay time tPPD, and n is an integer not less than 2, the delay time setting circuit including means for setting the delay time of the first and second pre-stage delay circuits and the delay time of the first and second post-stage delay circuits so that tPPD satisfies the relationship given as following inequalities:

$$tBDDmin < n \times tCK - (tPPD + tREP) < tCK.$$

According to the present invention, the first and second pre-stage delay circuits and the first and second post-stage delay circuits in the clock synchronization circuit each include a signal input terminal, a signal output terminal, a plurality of control signal input terminals supplied with a plurality of tap selection signals from the delay time setting circuit, a first stage selection circuit for selecting one of the clock signal supplied from the signal input terminal and a signal of a fixed logic value is selected in accordance with the value of the corresponding first tap selection signal, and a plurality of unit delay circuits connected in cascade connection and arranged downstream of the first stage of the selection circuits. Each unit delay circuit includes a delay element supplied with an output of the selection circuit of the previous stage, and a selection circuit selecting one of the clock signal supplied from the signal input terminal and the output of the delay element, based on the value of the corresponding tap selection signal. The clock signal supplied from the signal input terminal is transmitted from the selection circuit of the unit delay circuit corresponding to the selected tap selection signal to the delay element of the unit delay circuit of the next stage and output from the signal output terminal through the unit delay circuit inserted between the unit delay circuit of the next stage and the signal output terminal.

According to the present invention, the delay time setting circuit includes a first frequency dividing circuit for frequency-dividing the input clock signal by 2n and for outputting the frequency-divided signal, a second delay circuit supplied with a frequency-divided signal output from the first frequency dividing circuit (referred to as [first frequency-divided signal] and for delaying the first frequency-divided signal a delay time equal to the delay time of the first delay circuit to output the so delayed signal, a first delay adding circuit supplied with an output signal of the second delay circuit and adding a preset delay time to the signal to output the resulting signal, a plurality of stages of delay elements, forming a delay line, and supplied with an output signal of the first delay adding circuit, a plurality of latch circuits for sampling the output signals of the plural stages of the delay elements, based on the first frequency-divided signal output from the first frequency dividing circuit, and outputting the resulting sampled signal, and a logic circuit supplied with output signals of the plural latch circuits and for detecting a transition edge of a signal transmitted on the delay line based on the results of sampling by the latch circuits to generate the tap selection signal.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRWINGS

PREFERRED EMBODIMENTS OF THE INVENTION

A preferred embodiment of the present invention is now explained. According to the present invention, a pre-delay circuit and a post-delay circuit are provided ahead and at back of a delay circuit string of the BDD (Bi-Directional Delay) configuration. The delay time tPPD is set for satisfying the relation:

$$tBDDmin < ntCK-(tPPD+tREP) < tCK \quad (10).$$

where n is a lock mode and is an integer not less than two, tCK is a period of a replica circuit, tREP is the delay time of the replica circuit, and tBDDmin is the minimum delay time (as from the inputting until the turning around in the delay circuit string) for which the BDD delay circuit string operates as regularly.

Figure 1:
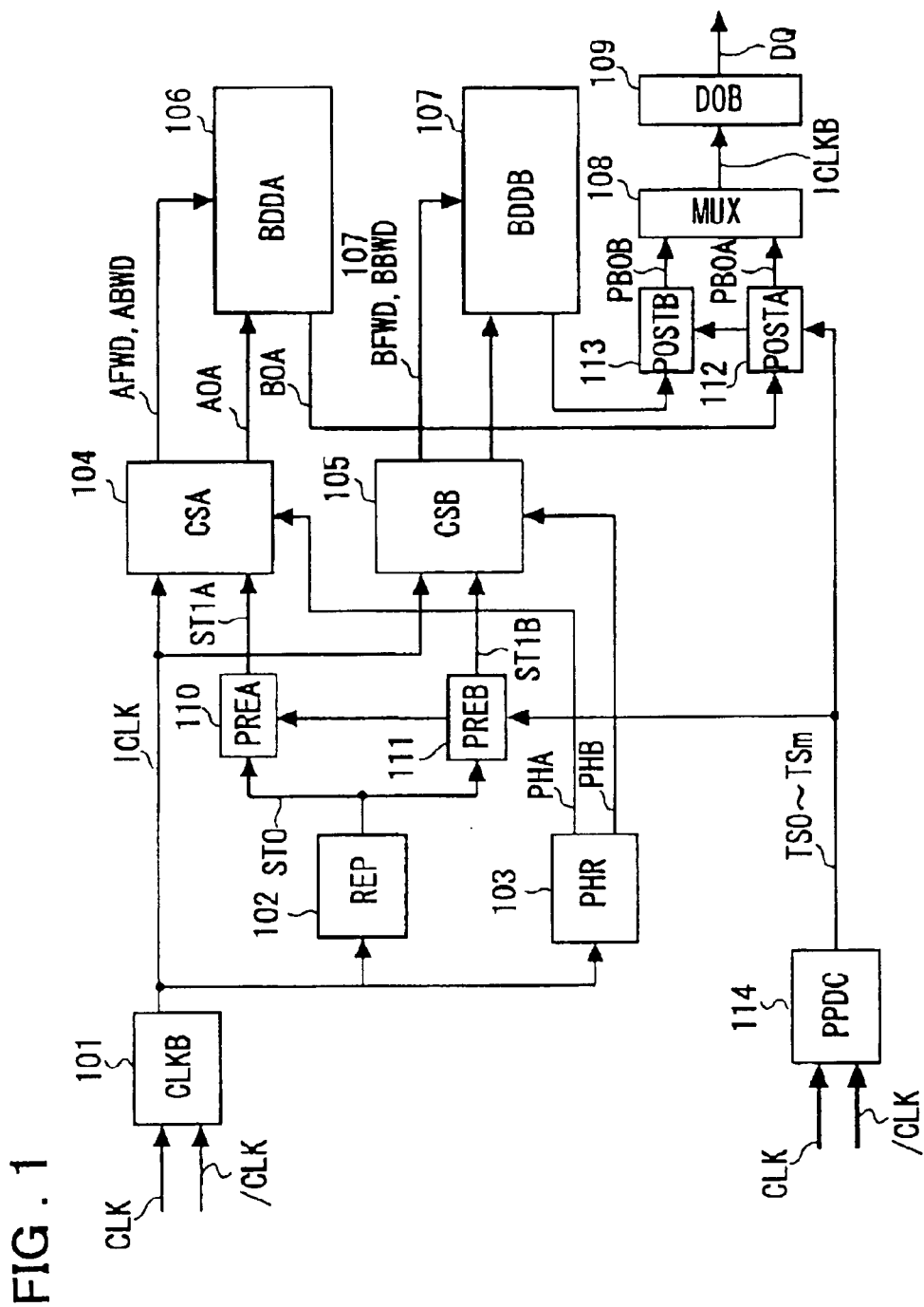
FIG. 1 shows the arrangement of a first embodiment of the present invention.
Figure 9A:
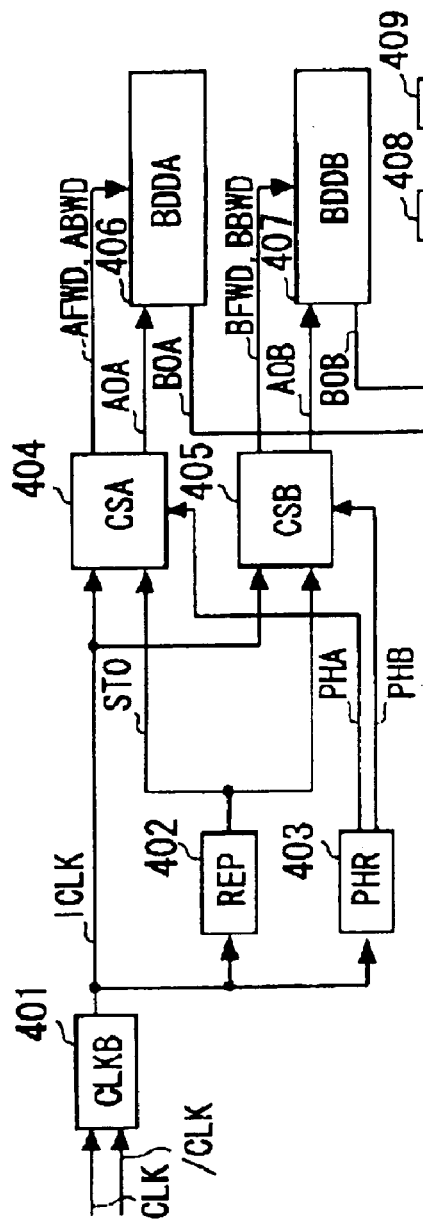
FIG. 9A shows an arrangement of a conventional clock synchronization circuit and FIG. 9B is a timing chart for illustrating the operation of the circuit of FIG. 9A.
Figure 9B:
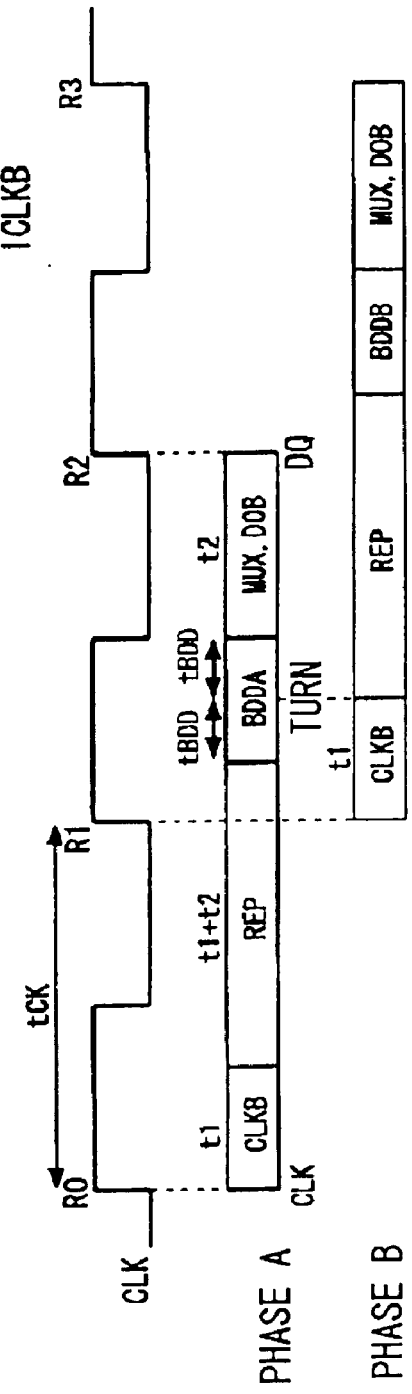

Referring to FIG. 1, a clock synchronization circuit, in accordance with an embodiment of the present invention, includes, in addition to a circuit configuration shown in FIG. 9, which comprises a clock buffer (CLKB) 101, a replica circuit (REP) 102, a phase selection circuit (PHR) 103, a control circuit (CSA) 104, a control circuit (CSB) 105, a delay circuit string (BDDA) 106, a delay circuit string (BDDB) 107, a multiplexer 108 (MUX), and an output circuit (DOB) 109, a pre-delay circuit (PREA) 110, a pre-delay circuit (PREB) 111, a post-delay circuit (POSTA) 112, a post-delay circuit (POSTB) 113 and a delay time setting circuit (PPDC) 114.

The delay time setting circuit (PPDC) 114 changes over tap selection signals TS0 to TSm, so that the delay time tPPD of the pre-delay circuits 110 and 111 and the post-delay circuits 112 and 113 satisfy the above equation (10).

Figure 5:
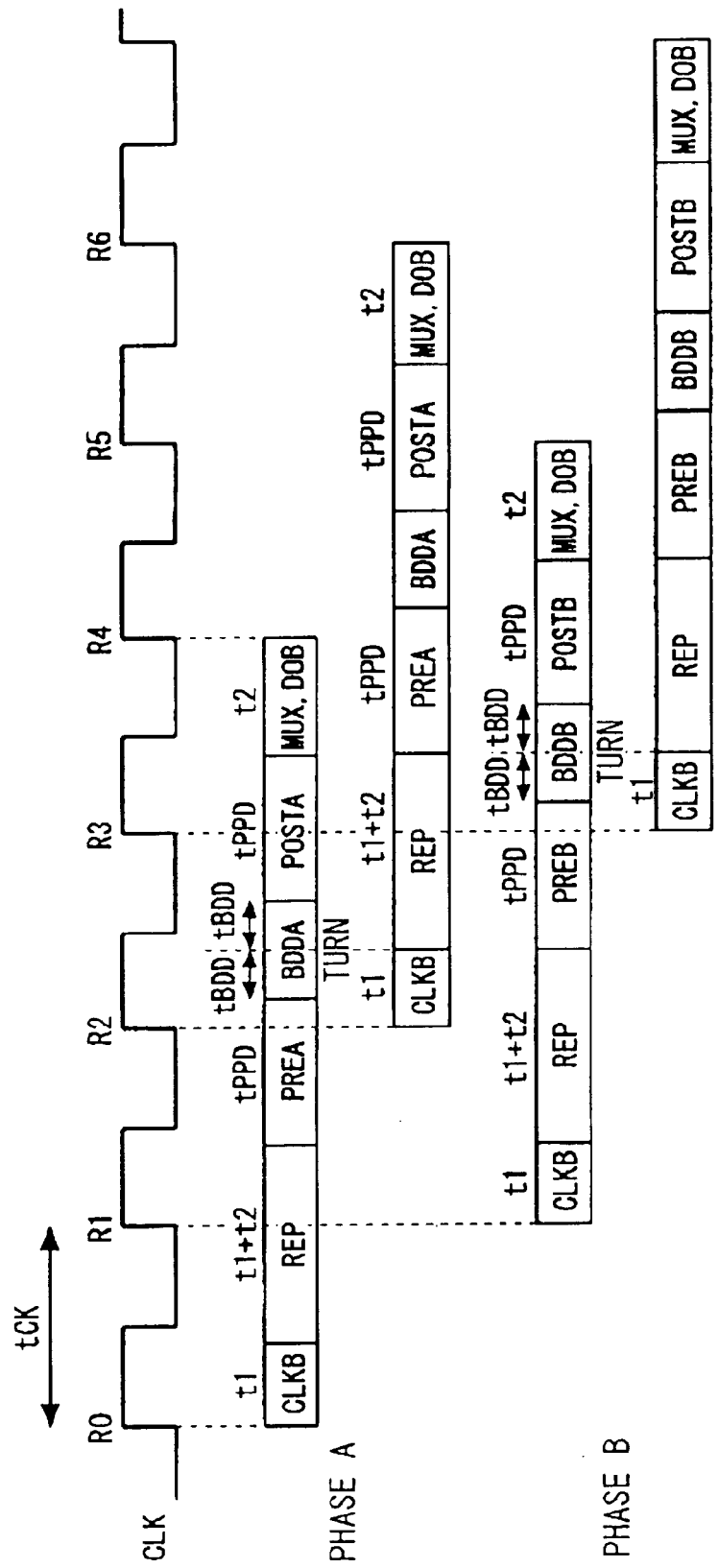
FIG. 5 is a timing chart for illustrating the operation of the first embodiment of the present invention.

With this configuration, the timing when the lock mode n is set to for example 2 is such that the clock access path, that is the delay time as from the receiving of the clock signal through the clock buffer (CLKB) 101, control circuit (CSA) 104, delay circuit string (BDDA) 106 (a turn), post-delay circuit (POSTA) 112 and the multiplexer 108 (MUX) to the data output terminal (DQ) of the output circuit (DOB) 109, is just equal to twice the clock period tCK of the external clock signal (CLK), such that data is output at the data output terminal (DQ) in synchronism with the clock edge, as shown in FIG. 5, In FIG. 5, the delay time tBDD of the delay circuit string (BDDA) 106 is equal to $$2tCK-(tPPD+tREP) \quad (11).$$

Thus, from the above condition (10) (tPPD being set for satisfying the relation tBDDmin<2tCK−(tPPD+tREP), it is guaranteed that the delay time tBDD is larger than the smallest delay time tBDDmin.

Moreover, since the delay circuit string (BDDA) 106 and the delay circuit string (BDDB) 107 operate once every two cycles and, from the above condition, $$tBDD < tCK \quad (12)$$

it is guaranteed that two consecutive operating periods are not overlapped with each other, that is, that signals do not collide with each other on the delay strings.

Thus, with the above-described structure of the present invention, only two delay circuit strings (as the number of phases) are required, such that the operation of the lock mode n can be performed.

Moreover, according to the present invention, the clock synchronization circuit with a short minimum operating period tCKmin can be realized with the small area and low power consumption For further detailed explanation of the above-described embodiment, preferred embodiments of the present invention are now explained with reference to the drawings. FIG. 1 shows the structure of a clock synchronization circuit according to a first embodiment of the present invention. Referring to FIG. 1, the clock synchronization circuit of the present embodiment includes a clock buffer circuit (CLKB) 101 which receives complementary clock signals (CLK and /CLK), supplied from outside the clock synchronization circuit in a differential mode, and outputs an internal clock signal (ICLK), a replica circuit (REP) 102 which receives the internal clock signal (ICLK), a phase selection circuit (PHR) 103 which receives the internal clock signal (ICLK) and outputs first and second control signals (PHA and PHB) for controlling the phase selection. The clock synchronization circuit also includes a control circuit (CSA) 104, a control circuit (CSB) 105, a delay circuit string of the BDD configuration (BDDA) 106, a delay circuit string of the configuration (BDDB) 107, a multiplexer (MUX) 108, and an output circuit (output buffer circuit) (DOB) 109. Additionally, the clock synchronization circuit includes a pre-delay circuit (PREA) 110, a pre-delay circuit (PREB) 111, a post-delay circuit (POSTA) 112, a post-delay circuit (POSTB) 113, and a delay time setting circuit (also termed a tap selection circuit) (PPDC) 114.

In the present embodiment, the clock buffer circuit (CLKB) 101, replica circuit (REP) 102, phase selection circuit (PHR) 103, control circuit (CSA) 104, control circuit (CSB) 105, delay circuit string (BDDA) 106, delay circuit string (BDDB) 107, multiplexer (MUX) 108 and the output circuit (output buffer circuit) (DOB) 109 are the same in configuration as the clock buffer circuit (CLKB) 401, replica circuit (REP) 402, phase selection circuit (PHR) 403, control circuit (CSA) 404, control circuit (CSB) 405, delay circuit string (BDDA) 406, delay circuit string (BDDB) 407, multiplexer (MUX) 408 and the output circuit (output buffer circuit) (DOB) 409 of FIG. 9A, respectively.

The phase selection circuit (PHR) 103 receives the internal clock signal (ICLK) from the clock buffer 101 to output first and second control signals for phase selection (PHA and PHB) alternately switched between activation and deactivation every cycle of the internal clock signal (ICLK). The control circuit (CSA) 104 receives the internal clocks (ICLK) from the clock buffer 101, an output signal (STIA) of the pre-delay circuit (PREA) 110 and the first control signal (PHA) to send the output signal (STIA) of the pre-delay circuit (PREA) 110 to the input terminal of the delay circuit string (BDDA) 106 as well as to output the turn control signal (AFWD/ABWD) based on the internal clock signal (ICLK) from the clock buffer 101. The control circuit (CSB) 105 receives the internal clock signal (ICLK) from the clock buffer 101, an output signal (STIB) from the pre-delay circuit 111 and the second control signal (PHB) to supply the output signal (STIB) of the pre-delay circuit (PREB) 111 to the input terminal of the delay circuit string (BDDB) 107, as well as to output the turn control signal BFWD/BBWD based on the internal clock signal (ICLK) from the clock buffer 101, when the second control signal (PHB) is activated. It is noted that the clock signal fed to the clock buffer (CLKB) 101 is not limited to the differential mode but may also be of a single-end configuration.

The pre-delay circuit (PREA) 110, post-delay circuit (POSTB) 111, post-delay circuit (POSTA) 112 and the post-delay circuit (POSTB) 113 are tap switching type variable delay circuits, such that, by switching the tap selection signals TS0 to TSm, the delay time can be changed step-wise.

The tap selection circuit (PPDC) 114 is a delay time setting circuit for variably setting the delay time tPPD of the pre-delay circuit (PREA)110 (pre-delay circuit (PREB) 111), and the post-delay circuit (POSTA) 112 (post-delay circuit (POSTB) 113), and changes over the tap selection signals TS0 to TSm for satisfying the following relation (inequalities):

$$tBDDmin < ntCK - (tPPD + tREP) < tCK \quad (13)$$

in accordance with the period tCK of the external clock (CLK) and the delay time tREP of the replica circuit (REP) 102.

It should be noted that n is an integer not less than 2, specifying the lock mode, and tBDDmin is the smallest delay time (smallest delay time as from the inputting until the turning around) for which the delay circuit string (BDDA) 106 and the delay circuit string (BDDB) 107 of the BDD configuration operate as normally.

Figure 2:
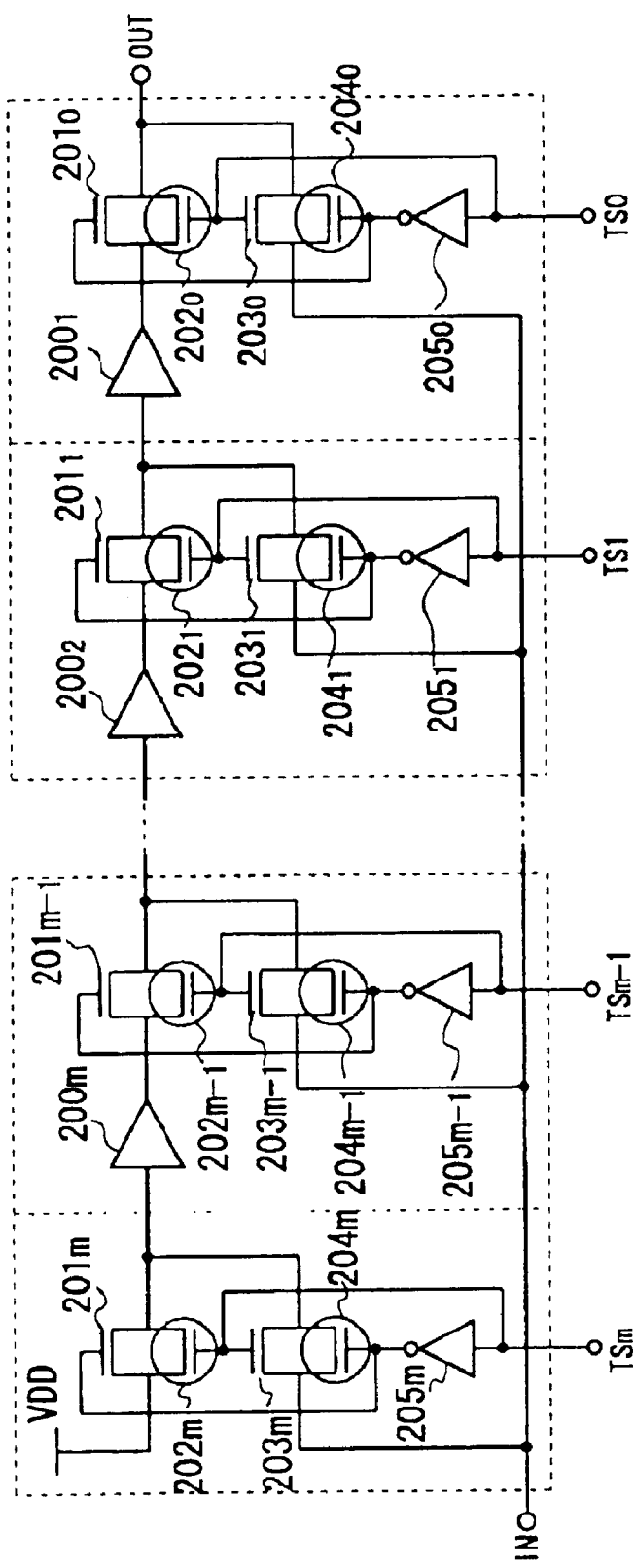
FIG. 2 shows the structure of a pre-delay circuit and a post-delay circuit of the first embodiment of the present invention.

FIG. 2 shows an illustrative structure of the pre-delay circuits (PREA, PREB) 110, 111 and the post-delay circuits (POSTA, POSTB) 112, 113. A number of delay elements $200_1$ to $200_m$ are connected in series, via a data selection circuit, composed of two transfer gates and an inverter, to form a variable delay line. This delay circuit includes an input terminal (IN), an output terminal (OUT), a plural number of control signal input terminals (TS0 to TSm) for receiving a plural number of tap selection signals, a first stage data selection circuit which comprises a first transfer gate composed of an NMOS transistor $201_m$ and a PMOS transistor $202_m$, a second transfer gate composed of an NMOS transistor $203_m$ and a PMOS transistor $204_m$ and an inverter $205_m$ for selecting the clock signals input from the input terminal (IN) or the signal of the fixed logic value (VDD power supply potential), depending on the value of the associated first tap selection signal TSm, and a plural number of the unit delay circuits connected in cascade connection and arranged downstream of the first stage data selection circuit.

The unit delay circuit includes a delay element $200_k$ (k=0 to m−1), receiving the output of the data selection circuit of the preceding stage, and a data selection circuit for selecting one of the clock signal, supplied from the input terminal (IN), and the output of the delay elements $200_k$, based on the value of the associated tap selection signal TSk. The data selection circuit is made up by a first transfer gate composed of an NMOS transistor $201_k$ and a PMOS transistor $202_k$, a second transfer gate composed of an NMOS transistor $203_k$ and a PMOS transistor $204_k$ and an inverter $205_k$. One of the tap selection signals TS0 to TSm is set to a HIGH level for programmably setting the delay time which is associated with the position of the data selection circuit selected by the associated tap.

For example, if the tap selection signal TS1 is selected (HIGH level), with the other tap selection signals being all not selected (LOW level), the signal is presented at the output terminal (OUT) by being supplied to the input terminal (IN) and transmitted through the transfer gate of the data selection circuit associated with the tap selection circuit TS1 (made up by the NMOS transistor $203_1$ and the PMOS transistor $204_1$), the delay element $200_1$ and the transfer gate of the data selection circuit (made up by the NMOS transistor $201_0$ and the PMOS transistor $202_0$).

Thus, by switching the tap selection signal TSk (0≦k≦m), the delay time tPPD from the input terminal (IN) up to the output terminal (OUT) may be adjusted step-wise, with the delay time of one delay element $200_k$ (k=1~m) and one stage of the transfer gate, referred to below as [tDE], as a unit.

Figure 3:
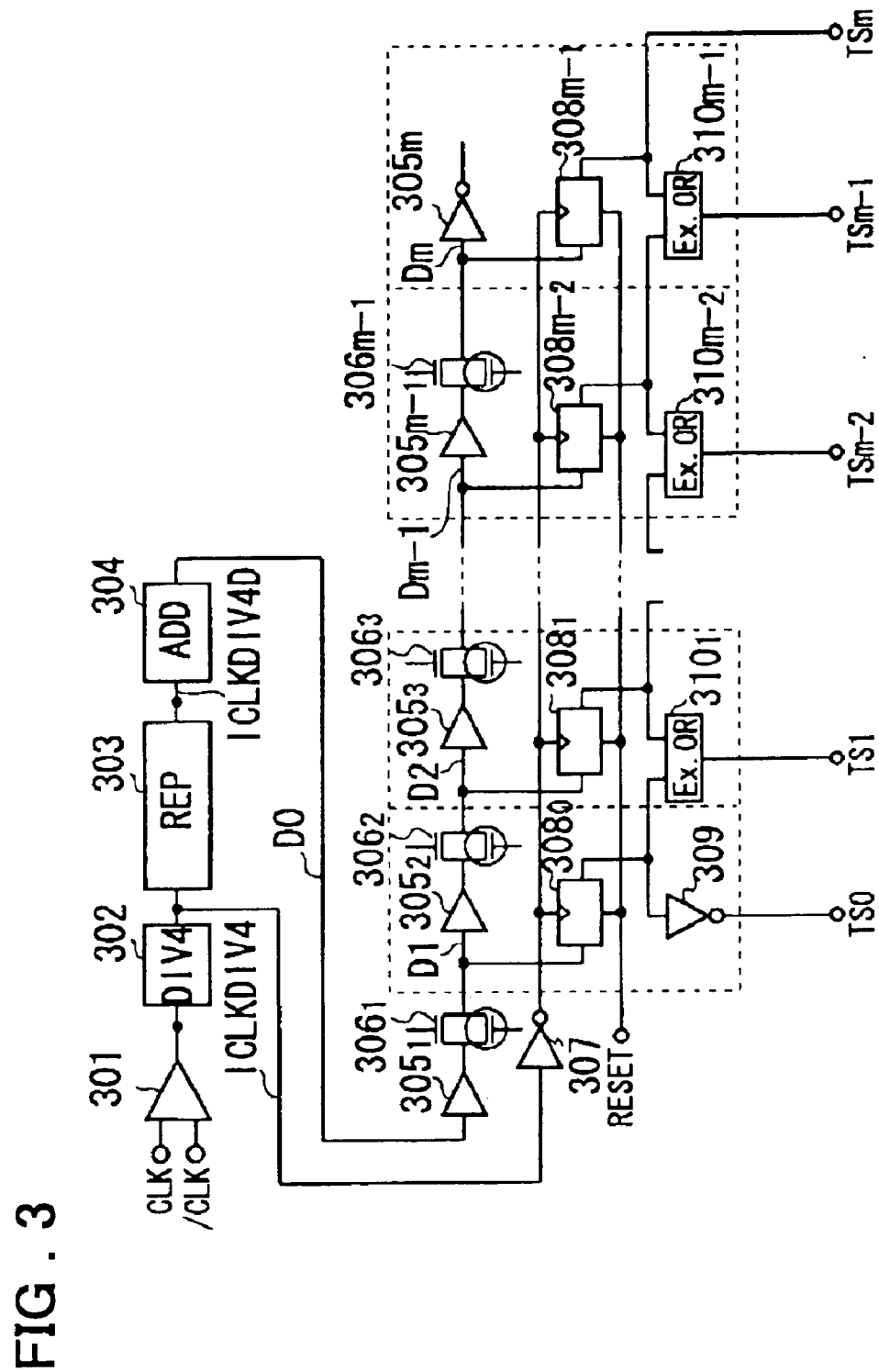
FIG. 3 shows an arrangement of a tap selection circuit of the first embodiment of the present invention.

FIG. 3 shows an example of a circuit configuration of the delay time setting circuit (PPDC) 114 of FIG. 1 when the lock mode n is set to 2. Referring to FIG. 3, the delay time setting circuit includes a clock buffer 301, a divide-by-4 frequency dividing circuit (DIV4) 302, a delay replica 303, and an delay adding circuit 304. An output of the delay adding circuit 304 is fed to a delay element $305_1$, while an output D1 of a transfer gate $306_1$, having an output of the delay element $305_1$ as input, is fed to the data input terminal of a flip-flop having a resetting function $308_0$. An output of an inverter 307, which receives an output of the divide-by-4 frequency dividing circuit (DIV4) 302 as an input, is fed to clock input terminals (indicated by ">") of flip-flops $308_0$ to $308_{m-1}$. A data output terminal of the flip-flop $308_0$ is connected to an input terminal of an inverter 309. A tap selection signal TS0 is output from the output terminal of the inverter 309. An output D1 of the transfer gate $306_1$ is supplied to the data input terminal of flip-flop having a resetting function $308_1$ via a delay element $305_2$ and a transfer gate $306_2$. A data output terminal of the flip-flop $308_1$ and a data output terminal of the flip-flop $308_0$ are connected to two input terminals of an exclusive OR (EXOR) circuit $310_1$, and a tap selection signal TS1 is output from the output terminal of the exclusive OR (EXOR) circuit $310_1$. In similar manner, an output Dm of the transfer gate $306_{m-1}$ is fed to a delay element $305_m$ and to a data input terminal of the flip-flop $308_{m-1}$. An output of a data output terminal of the flip-flop $308_{m-1}$ and an output of a data input terminal of the flip-flop $308_{m-2}$ are fed to two input terminals of an exclusive OR (EXOR) circuit $310_{m-1}$. A tap selection signal TSm-1 is output from an output terminal of the exclusive OR (EXOR) circuit $310_{m-1}$, while a tap selection signal TSm is output from a data output terminal of the flip-flop $308_{m-1}$.

The divide-by-4 frequency dividing circuit (DIV4) 302 frequency-divides the output of the clock buffer 301 by four to generate the time 2tCK (n=2) contained in the above formula (13).

The replica circuit (REP) 303 is the same as the replica circuit (REP) 102 of FIG. 1.

The delay adding circuit (ADD) 304 is a fixed delay circuit, as will be explained in detail subsequently. By setting the delay time tADD to a preset range, the tap selection signals TS0 to TSm are controlled so that the above relationship (13) will be met at all times to select the taps of the pre-delay circuits (PREA and PREB) 110, 111 and the post-delay circuits (POSTA and POSTB) 112, 113.

The delay elements $305_1$ to $305_m$ are interconnected in series, with interposition of the transfer gates $306_1$ to $306_{m-1}$ to form a delay line. The delay time of each delay element and that of each transfer gate are coincident with the delay time of the delay element 201 and that of the transfer gate, contained in the pre-delay circuits (PREA, and PREB) and the post-delay circuits, shown in FIG. 2, respectively.

The flip-flops $308_0$ to $308_{m-2}$ and the exclusive OR (EXOR) circuits $310_1$ to $310_{m-1}$ detect the position of a rising edge of a clock frequency-divided by four (ICLKDIV4), propagated on the above delay line, by the replica delay REP and the delay adding circuit (ADD) 304.

The flip-flops $308_0$ to $308_{m-1}$, having clock terminals for receiving a signal, output from the inverter 307 by complementing the frequency-divided by four clock signal (ICLKDIV4) output from the divide-by-4 frequency dividing circuit (DIV4) 302, sample levels of nodes D1 to Dm, at a falling edge of the frequency-divided by four clock signal (ICLKDIV4). The exclusive OR (EXOR) circuits $310_1$ to $310_{m-1}$, receiving sampled outputs of two neighboring flip-flop, compare the levels of two neighboring nodes Dk and Dk+1 to detect the position of the rising edge (k for which Dk=HIGH and Dk+1 is LOW) to select the associated tap selection signal TSK (HIGH level).

Figure 4:
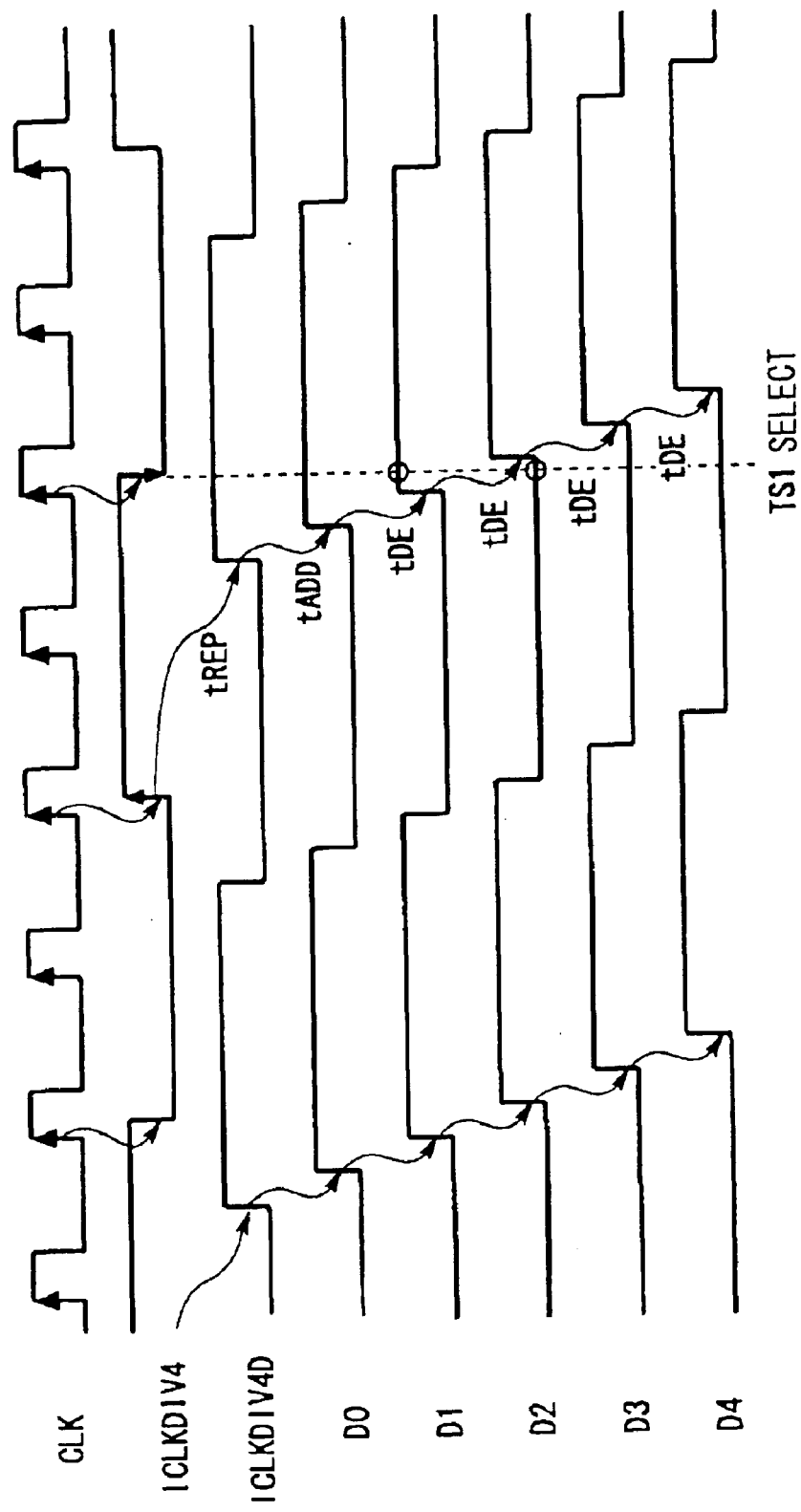
FIG. 4 is a timing chart for illustrating the operation of the tap selection circuit of the first embodiment of the present invention.

The operation of the clock synchronization circuit of the present embodiment is now explained. FIG. 4 is a timing diagram for explaining the operation of the delay time setting circuit (PPDC) 114 (also termed a [tap selection circuit]). Referring to FIGS. 3 and 4, the operation of the delay time setting circuit 114 is explained.

The frequency-divided by four clock signal (ICLKDIV4) is output from the divide-by-4 frequency dividing circuit (DIV4). If attention is directed to the rising edge thereof, indicated by upwardly pointed arrows, the signal edge is first delayed by tREP by a replica circuit (REP) 303 (ICLKDIV4), then delayed by tADD by the delay adding circuit (ADD) 304 and further delayed by delay time tDE of the delay element 305 and the transfer gate 306 for each stage on the delay line (D1, D2, D3, ...)

If levels of the nodes D1, D2, D3, ... are sampled by the flip-flops $308_0$, $308_1$, $308_2$, ... with falling edge of the frequency-divided by four clock signal(ICLKDIV4) (indicated by a downwardly pointed arrow), the output of the flip-flop 308, in the embodiment shown in FIG. 4, is at a HIGH level, while the outputs of the flip-flops $308_1$, $308_2$, $308_3$, ... are at a LOW level.

If then the outputs of the neighboring flip-flops 308 are ORed, only the tap selection signal TS1 is at HIGH level (selected), with the other tap selection signals being all zero (not-selected).

In this manner, the position of the edge proceeding on the delay line (the number of stages the edge has passed through) can be detected.

It may be seen from the timing shown in FIG. 4 that the following relationship generally holds:

$$tREP+tADD+ktDE+\Delta t=ntCK \quad (14)$$

where k denotes a position of the detected edge corresponding to $0 \leq k \leq m$ and k=1 in the case of FIG. 4.

In the above equation, $\Delta t$ is a detection error brought about by the delay on the delay line occurring stepwise. From FIG. 4, obviously $0 \leq \Delta t \leq tDE$.

The delay elements of the pre-delay circuits (PREA and PREB) 110 and 111 and the post-delay circuits (POSTA and POSTB) 112 and 113 are matched to the delay elements making up the delay line of delay time setting circuit (PPDC), also termed a tap selection circuit. The delay time per stage is equal to the above tDE.

Thus, if the tap selection signal TSk has been selected, the delay time tPPD of the pre-delay and the post-delay, included in the above equation (1), is $$K \times tDE \quad (15).$$

By solving the above equation (14) for k×tDE, and substituting the result into tPPD of the inequalities (13), we have the following formula (inequalities) (16):

$$tBDD\text{min}<tADD+\Delta t<tCK \quad (16)$$

If $0 \leq \Delta t \leq tDE$ is taken into consideration, it is sufficient that, for satisfying the above formula (16), the following formula(inequalities) (17) holds:

$$tBDD\text{min}<tADD<tCK-tDE \quad (17)$$

That is, the tap satisfying the above equation (13) at all times can be selected by setting the delay time tADD of the delay adding circuit 304 so that the relation specified by the above inequalities (17) is met.

FIG. 5 is a timing diagram for illustrating the overall operation of a clock synchronization data outputting circuit of the present embodiment (data outputting circuit of the semiconductor storage device). Referring to FIG. 5, the overall operation of the clock synchronization data outputting circuit of the present embodiment will be described. In the following description, it is assumed that the lock mode n is 2 for simplicity. It is also assumed that an appropriate tap satisfying the above formula (13) has already been selected in accordance with the above explanation.

If, in FIG. 5, attention is directed to the operation of the phase A, the rising edge (R0) of the external clock signal (CLK) is supplied to the delay circuit string (BDDA) 106 through the clock buffer 101, replica (REP) 102 and the pre-delay (PREA) 110 of FIG. 1.

The clock edge proceeding on the delay circuit string (BDDA) 106 towards right has its proceeding direction reversed by the turn control signal AFWD/ABWD, generated from the rising edge (R2) of the external clock signal (CLK), to proceed towards left to present itself at an output (BOA) of the delay circuit string (BDDA) 106.

It is a basic characteristic of the delay circuit string of the BDD configuration that the time as from entering to the delay circuit strings 106 and 107 until turning around is equal to the time as from the turning around until outputting (indicated [tBDD] in FIG. 5). This is the same operation as that of the conventional BDD circuit shown for example in FIG. 9.

The edge output from the delay circuit string (BDDA) 106 reaches the output buffer (DOB) 109 through the post-delay circuit (POSTA) 112 and the multiplexer (MUX) 108 so that data is output at the data output terminal (DQ).

The delay time from the rising edge (R2) of the external clock signal (CLK) until data outputting at the data output terminal (DQ) may be calculated to be equal to $$T1+tBDD+tPPD+t2 \quad (18).$$

As for the time as from the clock edge (R0) until turning around in the delay circuit string (BDDA) 106, we have the following equation:

$$t1+(t1+t2)+tPPD+tBDD=2tCK+t1 \quad (19)$$

From the above equation, the following equation $$t1+tBDD+tPPD+t2=2tCK \quad (20)$$

is derived so that the data outputting from the data output terminal (DQ) occurs in synchronism with the timing of the rising edge (R4) of the external clock signal (CLK).

In order for the above operation to take place as normally, the delay tBDD of the delay circuit string of the BDD configuration needs to be within a preset range, the lower limit thereof being the minimum delay time tBDDmin as determined by circuit characteristics of the delay circuit string of the BDD configuration (usually on the order of 0.3 ns to 0.5 ns).

The upper limit of the above preset range is tCK or the maximum delay time tBDDmax, as determined by the number of stages of the BDD delay circuit string, whichever is smaller.

The reason the upper limit of the above range is controlled by tCK is that, if, as may be seen from FIG. 5, tBDD>tCK    (21)

the two consecutive delay circuit string operations, such as edges R2 and R4, are overlapped, that is that, in the BDD delay circuit string, before the turned edge is output from the delay circuit string, the edge next to the turned edge in the BDD delay circuit string reaches the input of the delay circuit string.

If the fact that tBDD=2tCK−(tPPD+t1+t2)    (22)

and that the delay REP of the replica 102 is such that tREP=t1+t2, is taken into account, the above-mentioned condition pertinent to the upper and lower limits of tBDD are met by the condition of the above equation (13) (insofar as the case of tCK<tBDDmax is concerned).

Although the foregoing is concerned with the operation of the phase A, the operation of the phase B is the same, such that a clock synchronization circuit may be realized in which, by carrying out the two operations alternately from one cycle to the next, data is output in synchronism with the totality of the rising edges of the clocks on the whole.

With the present embodiment, described above, a clock synchronization circuit may be realized which is actuated in the lock mode n (n being an integer not less than two), so that the lower limit tCKmin of the clock period that enables the circuit operation may be lower than in a clock synchronization circuit having the conventional delay circuit string of the BDD configuration.

That is, referring to the above equation (13), the lower limit of the clock period tCKmin is determined by the condition:

tBDDmin<ntCK−(tPDD+tREP)    (23).

It is noted that, by selecting the tap selection signal TS0 to a HIGH level, the delay time tPPD of the pre-delay circuits 110 and 111 and the post-delay circuits 112 and 113 may be reduced to the delay time of one transfer gate stage of the pre-delay circuits 110 and 111 and the post-delay circuits 112 and 113 (see FIG. 2). Thus, by assuming this delay time to be negligible, and by rewriting the above equation (23) into the form of a condition for the clock period tCK, we have the following relation (inequality) (24):

tCK>(tBDDmin+tREP)/n    (24)

It is seen from the above formula (24) that, by increasing the lock mode n, the lower limit tCKmin is lowered in inverse proportion to the value of the lock mode n. Meanwhile, the conventional delay circuit string of the BDD configuration corresponds to the case of n=1.

Figure 10:
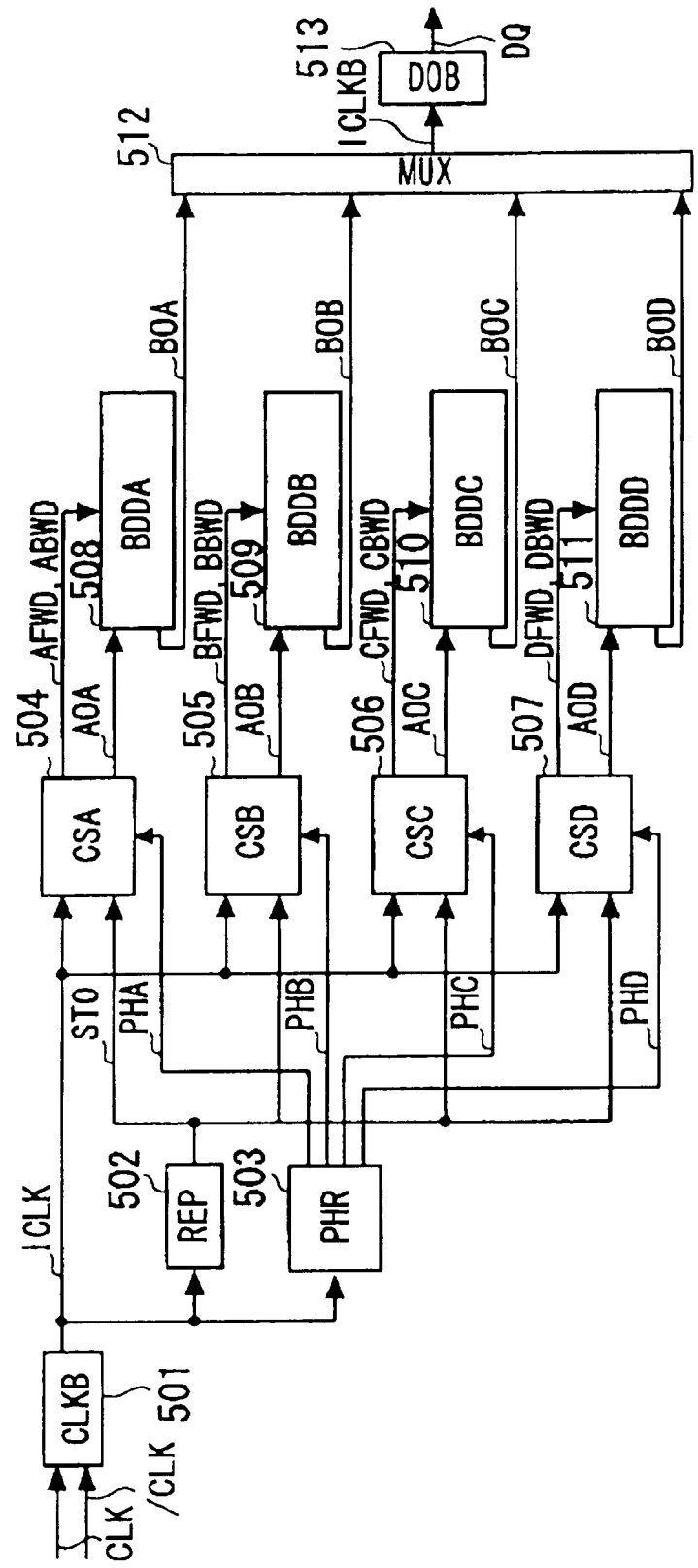
FIG. 10 shows an arrangement of a conventional clock synchronization circuit.
Figure 11:
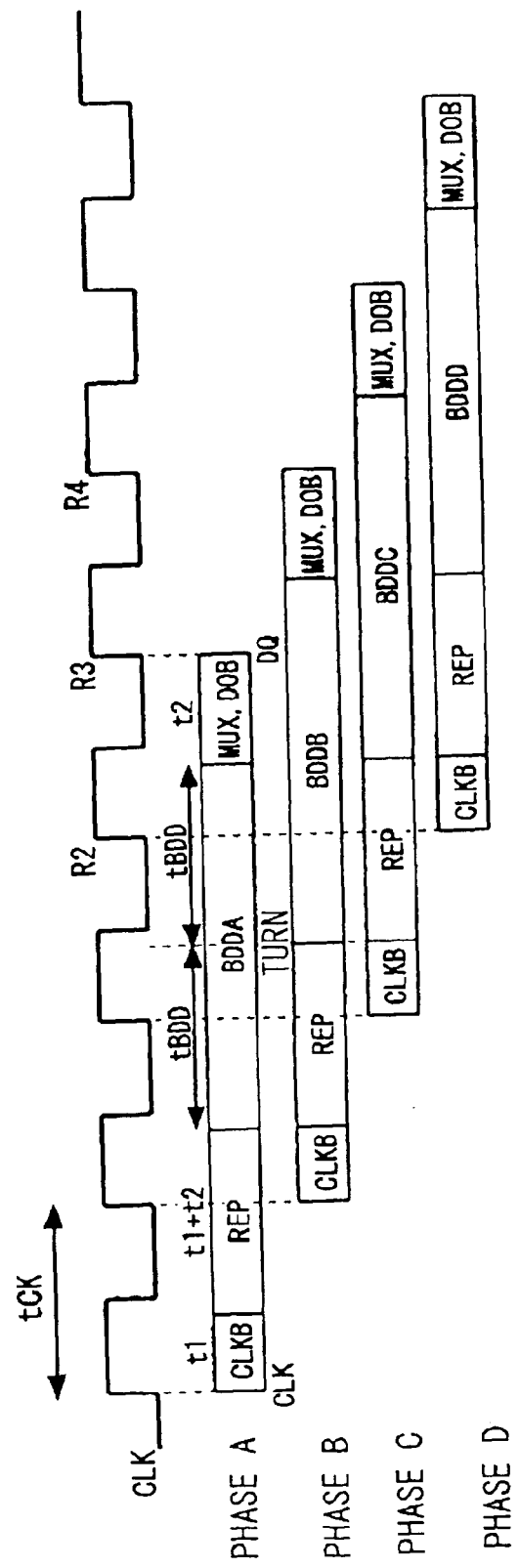
FIG. 11 is a timing chart for illustrating the operation of the conventional clock synchronization circuit of FIG. 10.

In addition, the present embodiment has an advantage that the circuit area and power dissipation may be reduced as compared to those in the delay circuit string of the BDD configuration of the four-phase driving system shown in FIG. 10 (corresponding to the case of the lock mode n=2). One reason for this is that, in the present embodiment, the number of the phases of the delay circuit string of the BBD configuration may be two which is halved as compared to that in the configuration shown in FIG. 10. Another reason is that the circuit scale per one phase necessary for implementing the same tCKmin may be smaller.

The latter reason is scrutinized in more detail. In the delay circuit string of the BBD configuration of the four-phase driving system shown in FIG. 10, the totality of the delay from the output of the replica 502 to the multiplexer 512 is taken charge of by the BDD delay circuit string, whereas, in the embodiment of the present invention, shown in FIG. 1, a significant proportion of the delay is taken charge of by the pre-delay circuits 110 and 111 and by the post-delay circuits 112 and 113. It should be noted that the circuit area necessary for realizing the same delay time may be smaller in the pre-delay circuits 110 and 111 and the post-delay circuits 112 and 113 shown in FIG. 2 than in the delay circuit string of the BBD configuration. The reason is that the pre-delay circuits 110 and 111 and by the post-delay circuits 112 and 113 may be simpler than the delay circuit string of the BBD configuration in the circuit configuration per one stage of the delay elements, and that, since the delay time tDE per stage may be set to a larger value to decrease the number of stages and hence the circuit scale of the delay line in its entirety may be smaller than in the BDD.

How large may be the setting value for the delay time tDE per stage depends on the value of tCKmin to be achieved and the minimum delay time tBDmin of the BDD delay circuit string (typically 0.3 ns to 0.5 ns).

For example, if tCKmin=3 ns, tBDDmin=0.5 ns and tADD=1 ns, the condition of the formula (17) may be met if tDE<1 ns, even if the variations of tBDDmin and tADD are varied up to ±50% depending on the process conditions, power supply voltage or temperature. Thus, it may be seen that tDE may be set to a value larger than the typical delay time per stage of the BDD delay circuit string (which is on the order of 0.5 ns).

A another embodiment of the present invention is now explained. The basic configuration of the second embodiment of the present invention is similar to that of the previous embodiment, described with reference to FIG. 1. However, the configuration of the delay time setting circuit (PPDC) 114, also termed a tap selection circuit, is further modified for improving jitter characteristics in an area of a longer clock period (tCK) and for reducing the current consumption.

Figure 6:
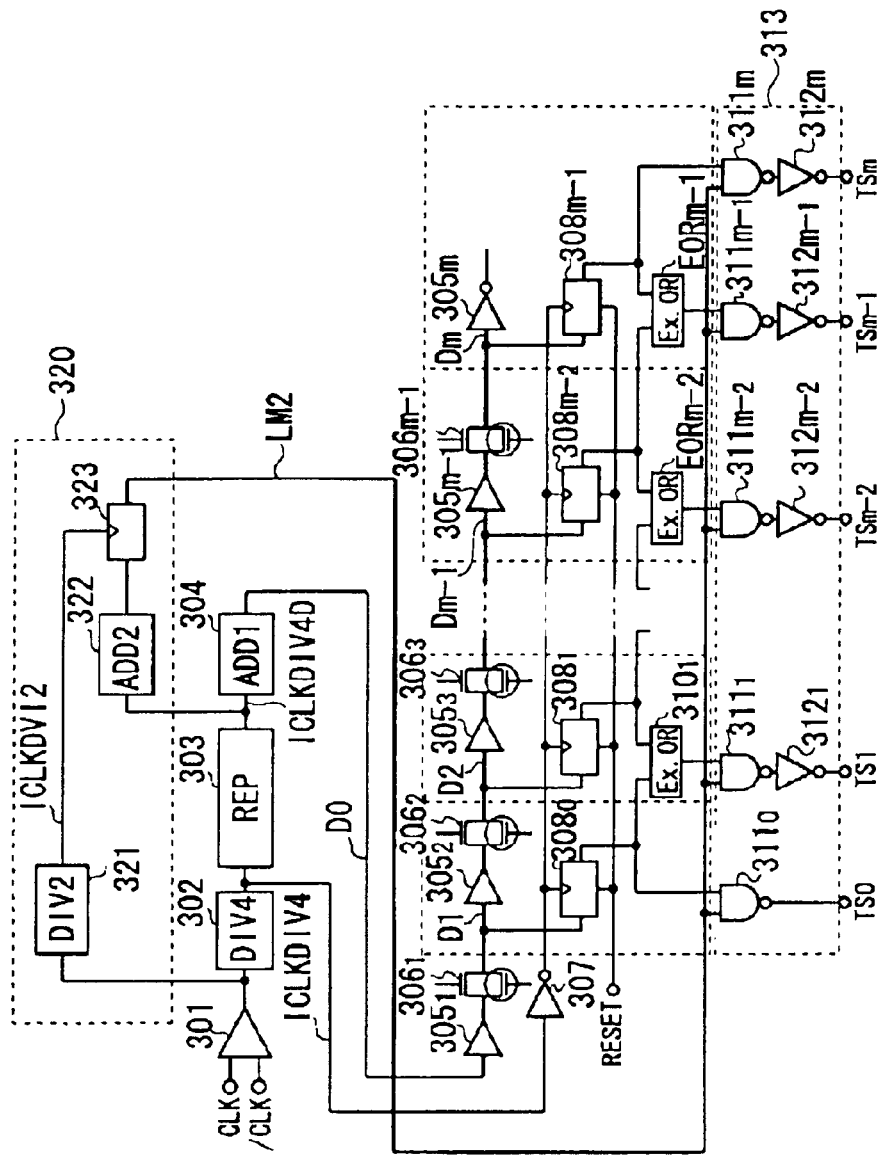
FIG. 6 shows the configuration of a tap selection circuit of a second embodiment of the present invention.

FIG. 6 shows the circuit configuration of the tap selection circuit 114 in accordance with the second embodiment of the present invention. In FIG. 6, a lock mode decision circuit (LMD) 320 and a tap selection signal resetting circuit (TSR) 313 for resetting the tap selection signals (TS0 to TSm), made up by a NAND gate 601 and an inverter 602, are provided in addition to the structure shown in FIG. 3.

The lock mode decision circuit (LMD) 320 is made up by a divide-by-2 frequency dividing circuit (DIV2) 321, receiving an output of the buffer circuit 301 as input, a second delay adding circuit (ADD2) 322 and a flip-flop 323, and performs the operation of switching the lock mode n to n=1 or n=2 depending on the frequency of the external clock signal (CLK). In FIG. 6, the elements which are the same as those of the tap selection circuit (PPDC) 114 shown in FIG. 3 are indicated by the same reference numerals. The structure and the operation of the present embodiment are the same as those of the embodiment shown in FIG. 3 except the lock mode decision circuit (LMD) 320 and the tap selection signal resetting circuit (TSR) 313 for resetting the tap selection signal (TS0 to TSm).

Figure 7:
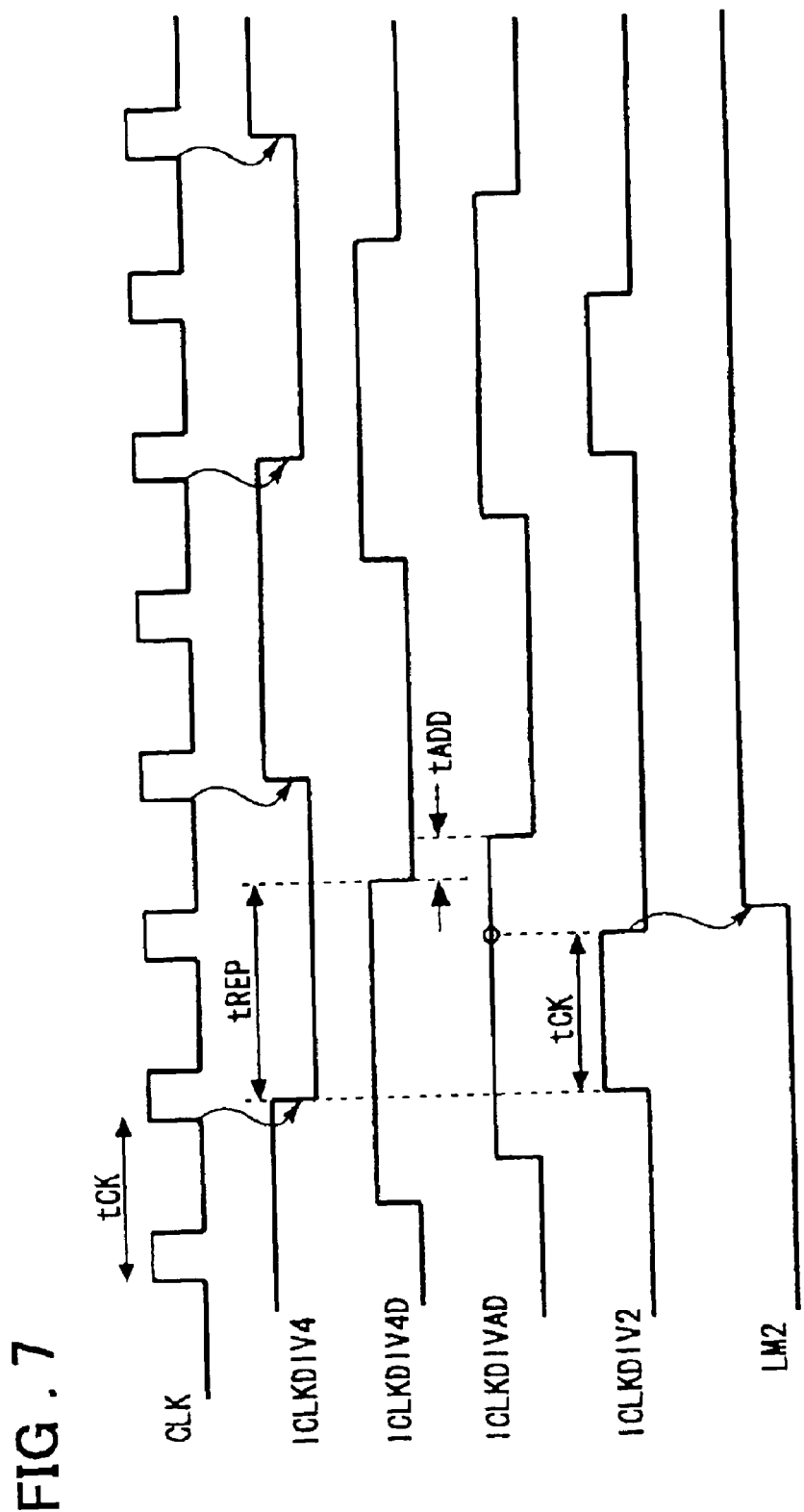
FIG. 7 is a timing chart for illustrating the operation of the tap selection circuit of a second embodiment of the present invention.

FIG. 7 illustrates the operation of the tap selection (PPDC) circuit 114 shown in FIG. 6. FIG. 7 shows a timing chart in case the period tCK of the external clock signal (CLK) is relatively short and the lock mode n=2 is selected.

A signal (ICLKDIV4AD) obtained on delaying the output signal (ICLKDIV4D) of the replica (REP) 303 by the second delay adding circuit (ADD2) 322 by a adding a delay of tADD2 is fed to the data input terminal of the flip-flop 323. If the signal (ICLKDIV4AD) is sampled by a falling edge of the output (ICLKDIV2) of the divide-by-2 frequency dividing circuit (DIV4) 321, $$tCK < tREP + tADD2 \quad (25)$$

so that the output (LM2) is at a HIGH level.

By so doing, the tap selection signals TS0 to TSm are in the identical state as TS0 to TSm in the above-described embodiment shown in FIG. 3 and performs the operation of the lock mode n=2.

Figure 8:
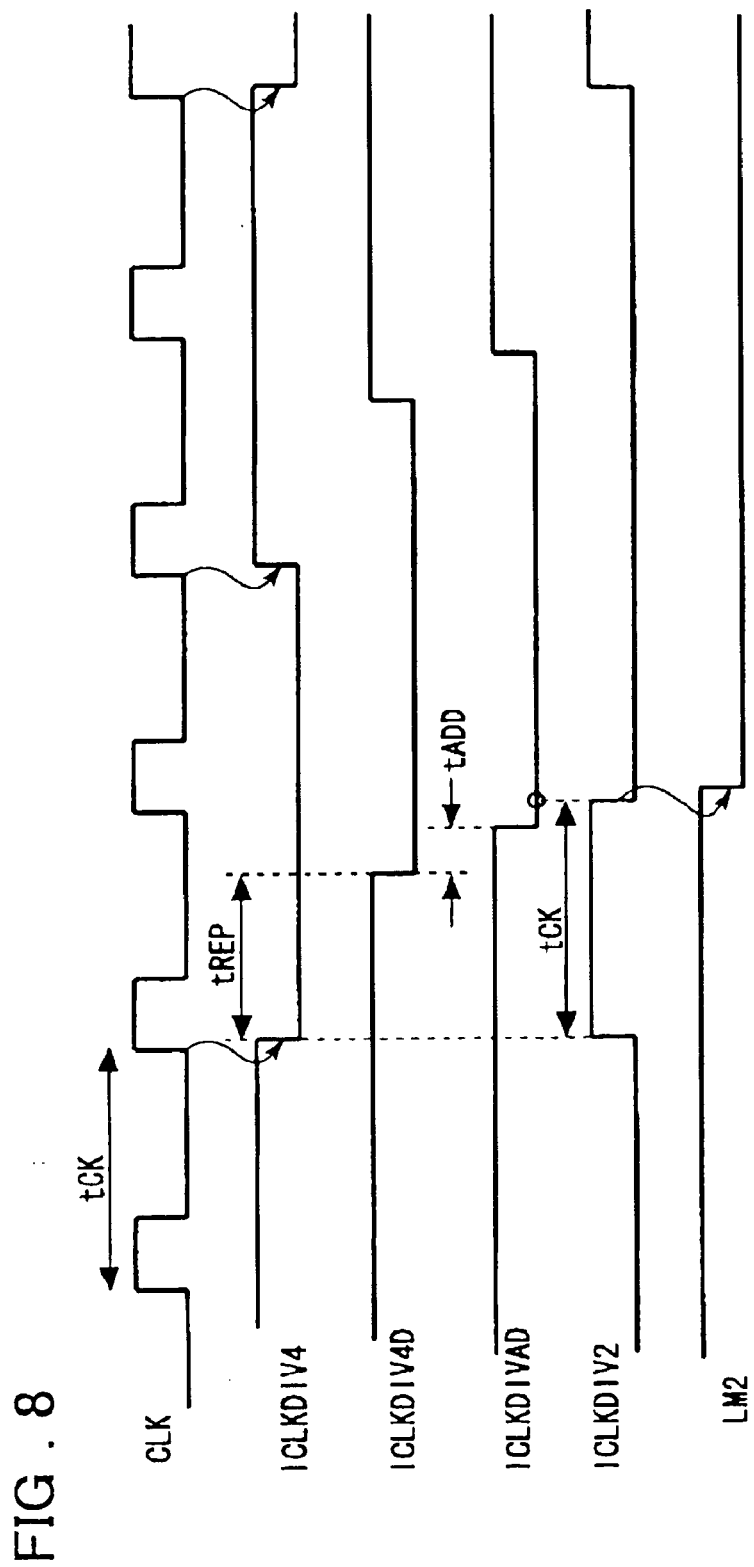
FIG. 8 is a timing chart for illustrating the operation of the tap selection circuit of a second embodiment of the present invention.

FIG. 8 depicts a timing chart for illustrating the operation in case the period tCK of the external clock signal (CLK) is longer and the lock mode n=1 is selected.

Since $$tCK > tREP + tADD2 \quad (26),$$

as shown in FIG. 8, if the output (ICLKDIV4AD) of the second delay adding circuit (ADD2) 322 is sampled with the falling edge of the output (ICLKDIV2) of the divide-by-2 frequency dividing circuit (DIV4) 321, an output (LM2) of the flip-flop 323 is at the LOW level.

Consequently, the tap selection signals (TS0 to TSm) are fixed in the TS0 selecting state (the state in which only the tap selection signal TS0 is at the HIGH level, with the remaining signals being all at the LOW level), without dependency on the outputs of the flip-flops 3080 to 308m-1.

The result is that the number of delay stages of the pre-delay circuits 110 and 111 and the post-delay circuits 112 and 113 is 0 (meaning that the delay is that for one transfer gate stage shown in FIG. 2), and hence the operation for the lock mode of n=1 is performed, as in the case of the conventional circuit shown in FIG. 9.

Meanwhile, as may be apparent from the foregoing description, the clock period tCK of the switching between the lock mode n=1 and the lock mode n=2 is $$tREP + tADD2 \quad (27)$$

meaning that a margin equal to the second additional delay time tADD2 is provided with respect to the operating limit for the lock mode of n=1 of $$tCK = tREP \quad (28).$$

The purpose of doing this is to prevent the situation of $$tCK < tREP \quad (29)$$

from occurring even if tREP is fluctuated due to changes in the power supply voltage and temperature following the lock mode decision.

With the present embodiment, described above, switching is made automatically to the lock mode n=1 operation in a range of the clock period (tCK) for which the operation with the lock mode n=1 is possible. Consequently, the jitter and the power dissipation may be diminished with advantage as compared to the case of the above embodiment of FIG. 3 in which the operation is that with the lock mode n=2 for the entire range of the clock period.

Specifically, one of the reasons for jitter is that the delay time on the delay line is varied from one cycle to another. For the same width of variations of the power supply voltage, the amount of variations of the delay time, that is the jitter, is increased in proportion to the delay time over the entire delay line.

It is noted that the delay time of the path from the clock buffer 101 through the replica 102, delay circuit strings of the BDD configuration 106, 107 and the multiplexer 108 to a data output at the data output terminal (DQ) is 2tCK and 4tCK for the lock mode n=1 and the lock mode n=2, respectively.

Thus, if comparison is made for the same clock period tCK (provided that the clock period tCK allows for the operation with the lock mode n=1), the jitter is smaller in case n=1.

As for the power dissipation, it is increased approximately in proportion to the number of stages of the delay line in its entirety, if comparison is made for the same clock period tCK. Consequently, the power consumption is more favorable in case n=1.

The present invention may be applied with advantage to for example a DDR-SDRAM. However, the present invention may of course be applied to any optional clock synchronization circuit adapted for generating and outputting signals synchronized with an external clock. Although the present invention has been explained with reference to the embodiments illustrated, the present invention is not limited to these specified embodiments and, as may be apparent to those skilled in the art, various modification or corrections may be envisaged without departing from the scope and the purport of the invention as defined in the appended claims.

The meritorious effects of the present invention are summarized as follows.

According to the present invention, described above, which realizes the clock synchronization circuit operating with the clock mode n, where n is an integer not less than 2, the lower limit tCKmin of the clock periods that permits the operation may be lowered with advantage as compared to the conventional delay circuit string of the BDD configuration.

Moreover, according to the present invention, the circuit area and the power consumption can be reduced with advantage as compared to the conventional delay circuit string of the BDD configuration of the four-phase driving system (corresponding to the lock mode of n=2). The reason is that the number of phases of the delay circuit string of the BDD configuration equal to one-half that of the conventional delay circuit string, that is two, suffices, and that a circuit scale per phase necessary for realizing the same maximum cycle time tCKmax may be smaller.

The present invention also has a merit that, in a range of the clock period (tCK) for which the operation with the lock mode n=1 is possible, the operation is automatically switched to the operation with the lock mode n=1, whereby the jitter and the power consumption may be diminished.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock synchronization circuit comprising:
   first and second bidirectional delay circuit strings, each circuit string having an input terminal and an output terminal, in which an edge of a clock signal received at said input terminal proceeds in one direction and then is reversed in the proceeding direction thereof, based on a turn control signal generated on the basis of an edge of a clock signal next following said input clock signal, said clock edge proceeding in the direction reverse to said one direction, over a time equal to the time during which said clock edge proceeded in said one direction, so as to be output at said output terminal;

a first pre-stage delay circuit and a first post-stage delay circuit, delay times thereof being able to be variably set, arranged at a pre-stage and at a post-stage of said first bidirectional delay circuit string, respectively;

a second pre-stage delay circuit and a second post-stage delay circuit, delay times thereof being able to be variably set, arranged at a pre-stage and at a post-stage of said second bidirectional delay circuit string, respectively;

a multiplexing circuit receiving output signals of said first and second post-stage delay circuits to output a multiplexed signal of said output signals of said first and second post-stage delay circuits; and a delay time setting circuit for performing control for variably setting the delay time of said first and second pre-stage delay circuits and the delay time of said first and second post-stage delay circuits, wherein said delay time setting circuit variably controls the delay times of said pre-stage and post-stage delay circuits according to a relationship between a minimum delay time for circuit operation and a period of said clock signal received by the clock synchronization circuit;

wherein the clock signal received by the clock synchronization circuit is supplied in common to the input terminals of said first and second pre-stage delay circuits; and wherein the clock synchronization circuit further comprises phase selection controlling means for alternately selecting a first path including said first pre-stage delay circuit, said first bi-directional delay circuit string and said first post-stage delay circuit and a second path including said second pre-stage delay circuit, said second bi-directional delay circuit string and said second post-stage delay circuit, in an interval of a preset cycle of said clock signal.

2. The clock synchronization circuit according to claim 1, wherein each of said first and second pre-stage delay circuits and said first and second post-stage delay circuits includes:

a plurality of stages of delay elements; and a plurality of stages of selection circuits selecting delay elements among said plurality of stages of said delay elements that make up a delay line, wherein a delay time corresponding to a tap selection signal selected among a plurality of tap selection signals supplied from said delay time setting circuit is set.

3. The clock synchronization circuit according to claim 1, wherein each of said first and second pre-stage delay circuits and the first and second post-stage delay circuits includes:

a signal input terminal;

a signal output terminal;

a plurality of control signal input terminals for receiving a plurality of tap selection signals supplied from said delay time setting circuit;

a first stage selection circuit selecting one of the clock signal supplied from said signal input terminal and a signal of a fixed logic value in accordance with a value of the corresponding first tap selection signal; and a plurality of unit delay circuits connected in cascade connection and arranged downstream of said first stage selection circuit;

each unit delay circuit including:

a delay element receiving an output of a selection circuit of the preceding stage; and a selection circuit selecting one of the clock signal supplied from the signal input terminal and the output of said delay element, based on the value of the corresponding tap selection signal; and wherein the clock signal supplied from said signal input terminal is propagated from the selection circuit of the unit delay circuit corresponding to the selected tap selection signal to the delay element of the unit delay circuit of the next stage and output from said signal output terminal through the unit delay circuit inserted between the unit delay circuit of the next stage and said signal output terminal.

4. The clock synchronization circuit according to claim 1, wherein said phase selection controlling means alternately switches between a first path including said first pre-stage delay circuit, said first bi-directional delay circuit string and said first post-stage delay circuit string and a second path including said second pre-stage delay circuit, said second bi-directional delay circuit string and said second post-stage delay circuit string, in an interval of a preset cycle of said clock signal.

5. The clock synchronization circuit according to claim 1, further comprising a first delay circuit having an input terminal for receiving the clock signal to delay the clock signal a preset delay time and an output terminal for outputting the delayed clock signal, wherein the clock signal output from said output terminal of said first delay circuit is supplied in common to the input terminals of said first and second pre-stage delay circuits.

6. The clock synchronization circuit according to claim 5, wherein said delay time setting circuit sets the delay time of said first and second pre-stage delay circuits and the delay time of said first and second post-stage delay circuits, depending on a period of said clock signal and the delay time of said first delay circuit.

7. The clock synchronization circuit according to claim 5, further comprising:

a first buffer circuit, arranged in a preceding stage of the first delay circuit, having an input terminal for receiving the clock signal supplied to the clock synchronization circuit and an output terminal connected to the input terminal of said first delay circuit; and an output circuit for outputting an output signal at a signal output terminal, based on the output signal of said multiplexing circuit;

the delay time of said first delay circuit being equal to the sum of the delay time of said first buffer circuit, the delay time of said multiplexing circuit and the delay time of said output circuit.

8. The clock synchronization circuit according to claim 7, further comprising means for comparing a period of said clock signal with a delay time of a clock access path as from a transition edge of the clock signal supplied to the input terminal of said first buffer circuit until the outputting from the data output terminal of said output circuit and for automatically switching the delay time of said clock access path to one time or two times said clock period, whichever is more suitable.

9. The clock synchronization circuit according to claim 7, wherein a delay time of a clock access path as from a transition edge of the clock signal fed to the input terminal of said first buffer circuit until the outputting from the data output terminal of said output circuit is adjustable to n times the period of said clock signals, where n is an integer not less than 2.

10. The clock synchronization circuit according to claim 7, further comprising:

a phase selection circuit receiving the clock signal output from said first buffer circuit to output first and second phase selection signals, activation of first and second phase selection signals being switched in a controlled manner in an interval of a preset cycle of said clock signal;

a first control circuit receiving an output signal of said first buffer circuit, an output signal of said first pre-stage delay circuit and said first phase selection signal to supply the output signal of said first pre-stage delay circuit to an input terminal of said first bidirectional delay circuit as well as to output a turn control signal, based on an output signal of said first buffer circuit, when said first phase selection signal is activated; and a second control circuit receiving an output signal of said second buffer circuit, an output signal of said second pre-stage delay circuit and said second phase selection signal to supply the output signal of said second pre-stage delay circuit to an input terminal of said second bidirectional delay circuit as well as to output a turn control signal, based on an output signal of said second buffer circuit, when said second phase selection signal is activated.

11. The clock synchronization circuit according to claim 7, wherein in case of a minimum delay time from inputting of the clock signal until turning of the clock signal in each of said first and second bidirectional delay circuit strings being tBDDmin;

one period of said clock signal being tCK;

the delay time of said first delay circuit being tREP;

the delay time of said first and second pre-stage delay circuits and the delay time of said first and second post-stage delay circuits being the same delay time tPPD; and n being an integer not less than 2;

said delay time setting circuit sets the delay time of said first and second pre-stage delay circuits and the delay time of said first and second post-stage delay circuits so that tPPD satisfies a relationship given by following formula:

$$tBDDmin < n \times tCK - (tPPD + tREP) < tCK.$$

12. The clock synchronization circuit according to claim 11, wherein said delay time setting circuit includes:

a first frequency dividing circuit performing frequency-division of the input clock signal by 2n to output the frequency-divided signal;

a second delay circuit receiving the frequency-divided signal output from said first frequency dividing circuit (referred to as first frequency-divided signal) and delaying said first frequency-divided signal a delay time equal to the delay time of said first delay circuit to output the so delayed signal;

a first delay adding circuit receiving an output signal of said second delay circuit and adding a preset delay time to said signal to output the resulting signal;

a plurality of stages of delay elements, forming a delay line, and receiving an output signal of said first delay adding circuit;

a plurality of latch circuits, sampling the output signal of said plural stages of the delay elements, based on the first frequency-divided signal output from said first frequency dividing circuit, and outputting the resulting sampled signals; and a logic circuit receiving output signals of said plural latch circuits and detecting a transition edge of a signal transmitted on said delay line based on the results of sampling by said latch circuits to generate said tap selection signal.

13. The clock synchronization circuit according to claim 12, wherein said delay time setting circuit includes a second buffer circuit of a delay time equivalent to the delay time of said first buffer circuit; and wherein an output signal of said second buffer circuit is supplied to an input terminal of said first frequency dividing circuit.

14. The clock synchronization circuit according to claim 12, wherein said delay time setting circuit includes:

a lock mode decision circuit comprising:

a second frequency dividing circuit performing frequency-division of the input clock signal by n to output a second frequency-divided signal;

a second delay adding circuit receiving said second frequency-divided signal output from said second frequency dividing circuit and adding a preset delay time to said second frequency-divided signal to output the delayed signal; and a latch circuit sampling the signal output from said second delay adding circuit based on said second frequency-divided signal output from said second frequency dividing circuit; and a circuit generating said tap selection signals based on the output signals of said logic circuit which detects a transition edge of a signal transmitted on said delay line to generate said tap selection signal, and an output signal of said latch circuit of said lock mode decision circuit.

15. The clock synchronization circuit according to claim 14, wherein said delay time setting circuit includes a second buffer circuit of a delay time equivalent to the delay time of said first buffer circuit; and wherein an output signal of said second buffer circuit is supplied to an input terminal of said second frequency dividing circuit.

16. A semiconductor device, comprising:

a clock synchronization circuit said circuit including:

first and second bidirectional delay circuit strings each circuit string having an input terminal and an output terminal, in which an edge of a clock signal received at said input terminal proceeds in one direction and then is reversed in the proceeding direction thereof, based on a turn control signal generated on the basis of an edge of a clock signal next following said input clock signal, said clock edge proceeding in the direction reverse to said one direction, over a time equal to the time during which said clock edge proceeded in said one direction so as to be output at said output terminal;

a first pre-stage delay circuit and a first post-stage delay circuit, delay times thereof being able to be variably set, arranged at a pre-stage and at a post-stage of said first bidirectional delay circuit string, respectively;

a second pre-stage delay circuit and a second post-stage delay circuit, delay times thereof being able to be variably set, arranged at a pre-stage and at a post-stage of said second bidirectional delay circuit string, respectively;

a multiplexing circuit receiving output signals of said first and second post-stage delay circuits to output a multiplexed signal of said output signals of said first and second post-stage delay circuits; and a delay time setting circuit for performing control for variably setting the delay time of said first and second pre-stage delay circuits and the delay time of said first and second post-stage delay circuits, wherein said delay time setting circuit variably controls the delay times of said pre-stage and post-stage delay circuits according to a relationship between a minimum delay time for circuit operation and a period of said clock signal received by the clock synchronization circuit;

wherein the clock signal received by the clock synchronization circuit is supplied in common to the input terminals of said first and second pre-stage delay circuits; and wherein the clock synchronization circuit further comprises phase selection controlling means for alternately selecting a first path including said first pre-stage delay circuit, said first bi-directional delay circuit string and said first post-stage delay circuit and a second path including said second pre-stage delay circuit, said second bi-directional delay circuit string and said second post-stage delay circuit, in an interval of a preset cycle of said clock signal.

17. A semiconductor device, comprising:

a first buffer circuit having an input terminal for receiving a clock signal supplied to the semiconductor device and an output terminal for outputting the clock signal;

a first delay circuit receiving the clock signal output from said first buffer circuit and delaying the clock signal a preset delay time to output the delayed signal;

first and second pre-stage delay circuits, delay time thereof being able to be variably set, having input terminals connected in common to an output terminal of said first delay circuit and outputting a signal output from said first delay circuit with a delay;

a phase selection circuit receiving the clock signal output from said first buffer circuit to output first and second phase selection signals, activation of said first and second phase selection signals being switched in a controlled manner in an interval of one cycle of said clock signal;

first and second bidirectional delay circuit strings, each circuit string having an input terminal and an output terminal, in which an edge of a clock signal received at said input terminal proceeds in one direction and then is reversed in the proceeding direction thereof, based on a turn control signal generated on the basis of an edge of a clock signal next following said input clock signal, said clock edge proceeding in the direction reverse to said one direction over time equal to the time during which said clock edge proceeds in said one direction, so as to be output at said output terminal;

a first control circuit receiving the clock signal output from said first buffer circuit, the output signal of said first pre-stage delay circuit and said first phase selection signal to supply the output signal of said first pre-stage delay circuit to an input terminal of said first bidirectional delay circuit as well as to output a turn control signal, based on the clock signal output from said first buffer circuit, when said first phase selection signal is activated;

a second control circuit receiving the clock signal output from said first buffer circuit, the output signal of said second pre-stage delay circuit and said second phase selection signal to supply the output signal of said second pre-stage delay circuit to an input terminal of said second bidirectional delay circuit as well as to output a turn control signal, based on the clock signal output from said first buffer circuit, when said second phase selection signal is activated;

first and second post-stage delay circuits, delay time thereof being able to be variably set, arranged at a post-stage of said first and second bidirectional delay circuit strings, respectively;

a multiplexing circuit receiving output signals of said first and second post-stage delay circuits to output a multiplexed signal of said output signals of said first and second post-stage delay circuits;

an output circuit outputting data at a data output terminal based on the output signals of said multiplexing circuit; and a delay time setting circuit for variably setting the delay time of said first and second pre-stage delay circuits and the delay time of said first and second post-stage delay circuits, depending on the period of said clock signal and the delay time of said first delay circuit; wherein the delay time of said first delay circuit is equal to the sum of the delay time of said first buffer circuit, the delay time of said multiplexing circuit and the delay time of said output circuit; wherein switching is made between a first path including said first pre-stage delay circuit, said first bi-directional delay circuit string and said first post-stage delay circuit string and a second path including said second pre-stage delay circuit, said second bi-directional delay circuit string and said second post-stage delay circuit, in an interval of a preset cycle of said clock signal; and wherein a signal synchronized with the edge of said clock signal is output from said data output terminal.

18. The semiconductor device according to claim 17, wherein each of said first and second pre-stage delay circuits and the first and second post-stage delay circuits includes:

a signal input terminal;

a signal output terminal;

a plurality of control signal input terminals for receiving a plurality of tap selection signals output from said delay time setting circuit a first stage selection circuit selecting one of the clock signal supplied from said signal input terminal and a signal of a fixed logic value, in accordance with the value of the corresponding first tap selection signal; and a plurality of stages of unit delay circuits, connected in cascade connection, and arranged downstream of said first stage selection circuits; each unit delay circuit including:

a delay element receiving an output of the selection circuit of the previous stage; and a selection circuit selecting one of the clock signal supplied from the signal input terminal and an output of said delay element, based on the value of the corresponding tap selection signal; wherein the clock signal supplied from said signal input terminal is transmitted from the selection circuit of the unit delay circuit corresponding to the selected tap selection signal to the delay element of the unit delay circuit of the next stage and output from said signal output terminal through the unit delay circuit inserted between the unit delay circuit of the next stage and said signal output terminal.

19. The semiconductor device according to claim 17, wherein said delay time setting circuit includes:
- a first frequency dividing circuit performing frequency-division of the input clock signals by 2n to output the frequency-divided signal;
- a second delay circuit receiving the frequency divided signal output from said first frequency dividing circuit (termed first frequency-divided signal) and delaying said first frequency-divided signal a delay time equal to the delay time of said first delay circuit to output the so delayed signal;
- a first delay adding circuit receiving an output signal of said second delay circuit and adding a preset delay time to said signal to output the delayed signal:
- a plurality of stages of delay elements, forming a delay line, and receiving the delayed signal output from said first delay adding circuit;
- a plurality of latch circuits sampling the output signals of said plural stages of the delay elements, based on the first frequency-divided signal output from said first frequency dividing circuit, and outputting sampled signals; and
- a logic circuit receiving output signals of said plural latch circuits and detecting a transition edge of a signal transmitted on said delay line based on the sampling results by said latch circuits to generate said tap selection signal.

20. The semiconductor device according to claim 19, wherein said delay time setting circuit includes:
- a lock mode decision circuit comprising:
    - a second frequency dividing circuit performing frequency-division of the input clock signal by n to output a second frequency-divided signal;
    - a second delay adding circuit receiving the second frequency-divided signal output from said second delay circuit and delaying said second frequency-divided signal a preset delay time to output the delayed signal;
    - a latch circuit for sampling the signal output from said second delay adding circuit based on said second frequency-divided signals output from said second frequency dividing circuit; and
- a circuit generating said tap selection signals based on the output signals of said logic circuit which detects a transition edge of a signal transmitted on said delay line to generate said tap selection signal, and an output signal of said latch circuit of said lock mode decision circuit.

* * * * *